United States Patent
Chen et al.

(10) Patent No.: US 10,014,402 B1
(45) Date of Patent: Jul. 3, 2018

(54) HIGH ELECTRON MOBILITY TRANSISTOR (HEMT) DEVICE STRUCTURE

(71) Applicant: Taiwan Semiconductor Manufacturing Co., Ltd., Hsinchu (TW)

(72) Inventors: Kuei-Ming Chen, New Taipei (TW); Chi-Ming Chen, Zhubei (TW); Chung-Yi Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/434,325

(22) Filed: Feb. 16, 2017

Related U.S. Application Data

(60) Provisional application No. 62/434,126, filed on Dec. 14, 2016.

(51) Int. Cl.

| | | |
|---|---|---|
| *H01L 29/778* | (2006.01) |
| *H01L 29/66* | (2006.01) |
| *H01L 29/20* | (2006.01) |
| *H01L 29/205* | (2006.01) |
| *H01L 29/10* | (2006.01) |
| *H01L 29/207* | (2006.01) |
| *H01L 29/417* | (2006.01) |
| *H01L 23/31* | (2006.01) |
| *H01L 21/02* | (2006.01) |

(52) U.S. Cl.
CPC ...... *H01L 29/7787* (2013.01); *H01L 21/0254* (2013.01); *H01L 21/0262* (2013.01); *H01L 21/02458* (2013.01); *H01L 23/3171* (2013.01); *H01L 29/105* (2013.01); *H01L 29/1066* (2013.01); *H01L 29/2003* (2013.01); *H01L 29/205* (2013.01); *H01L 29/207* (2013.01); *H01L 29/4175* (2013.01); *H01L 29/66462* (2013.01)

(58) Field of Classification Search
CPC .............. H01L 29/66893–29/66924; H01L 29/02–29/325; H01L 29/7786; H01L 29/7787; H01L 29/66462; H01L 29/205; H01L 29/207; H01L 29/2003
See application file for complete search history.

(56) References Cited

U.S. PATENT DOCUMENTS

| | | | | |
|---|---|---|---|---|
| 8,866,192 B1 * | 10/2014 | Chen | ................... | H01L 21/2652 257/194 |
| 2010/0258841 A1 * | 10/2010 | Lidow | ................ | H01L 29/1066 257/192 |

* cited by examiner

*Primary Examiner* — Thanhha Pham
(74) *Attorney, Agent, or Firm* — Birch, Stewart, Kolasch & Birch, LLP

(57) ABSTRACT

A high electron mobility transistor (HEMT) device structure is provided. The HEMT device structure includes a channel layer formed over a substrate and an active layer formed over the channel layer. The HEMT device structure also includes a gate structure formed over the active layer, and the gate structure includes: a p-doped gallium nitride (p-GaN) layer or a p-doped aluminum gallium nitride (p-GaN) layer formed over the active layer, and a portion of the p-GaN layer or p-AlGaN layer has a stepwise or gradient doping concentration. The HEMT device structure also includes a gate electrode over the p-GaN layer or p-AlGaN layer.

20 Claims, 10 Drawing Sheets

HIGH ELECTRON MOBILITY TRANSISTOR (HEMT) DEVICE STRUCTURE

CROSS REFERENCE TO RELATED APPLICATIONS

This Application claims the benefit of U.S. Provisional Application No. 62/434,126, filed on Dec. 14, 2016, and entitled "HIGH ELECTRON MOBILITY TRANSISTOR (HEMT) DEVICE STRUCTURE", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

In semiconductor technology, Group III-Group V (or III-V) semiconductor compounds are used to form various integrated circuit devices, such as high power field-effect transistors, high frequency transistors, high electron mobility transistors (HEMTs), or metal-insulator-semiconductor field-effect transistors (MISFETs). The HEMTs have a number of attractive properties including high electron mobility and the ability to transmit signals at high frequencies.

Although existing HEMTs have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
FIGS. 1A-1L show cross-sectional representations of various stages of forming a high electron mobility transistor (HEMT) device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a semiconductor device structure and method for forming the same are provided. FIGS. 1A-1L show cross-sectional representations of various stages of forming a high electron mobility transistor (HEMT) device structure 100a, in accordance with some embodiments of the disclosure. The HEMT device structure 100a is a field effect transistor incorporating a junction between two materials with different band gaps (i.e., a heterojunction) as the channel instead of a doped region, as is generally the case for metal oxide semiconductor field effect transistors (MOSFETs).

Referring to FIG. 1A, a substrate 102 is provided. The substrate 102 may be made of silicon (Si) or other semiconductor materials. In some embodiments, the substrate 102 is a silicon wafer. In some embodiments, the substrate 102 is a silicon substrate having (111) lattice structure. The Si (111) substrate provides an optimal lattice mismatch with an overlying layer, such as a GaN layer. In some embodiments, the substrate 102 is made of a compound semiconductor such as silicon carbide (SiC), gallium arsenic (GaAs), indium arsenide (InAs), or indium phosphide(InP). In some embodiments, the substrate 102 is made of an alloy semiconductor such as silicon germanium, silicon germanium carbide, gallium arsenic phosphide, or gallium indium phosphide.

Figure 1B:
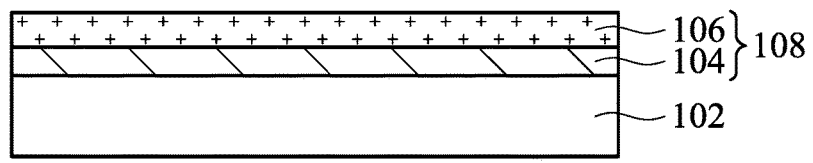

Afterwards, as shown in FIG. 1B, a transition structure 108 is formed over the substrate 102, in accordance with some embodiments of the disclosure. The transition structure 108 includes multiple layers. In some embodiments, the transition structure 108 includes a nucleation layer 104 and a transition layer 106 on the nucleation layer 104.

The nucleation layer 104 is used to compensate for a mismatch in lattice structures and/or a thermal expansion coefficient (TEC) between the substrate 102 and an overlying layer (e.g. the transition layer 106). In some embodiments, the nucleation layer 104 includes a step-wise change in lattice structure. In some embodiments, the nucleation layer 104 includes aluminum nitride (AlN). In some embodiments, the nucleation layer 104 has a thickness in a range from about 100 angstroms (Å) to 1000 angstroms (Å).

The transition layer 106 is used to facilitate gradual changes of the lattice structure and thermal expansion coefficient (TEC) between the nucleation layer 104 and an overlying layer (e.g. the buffer layer 110). In some embodiments, the transition layer 106 includes a graded aluminum gallium nitride layer ($Al_xGa_{1-x}N$), wherein x is the aluminum content ratio in the aluminum gallium constituent, and $0<x<1$. In some embodiments, the graded aluminum gallium nitride layer includes multiple layers each having a decreased x ratio (from a bottom layer adjoining the nucleation layer 104 to a top layer adjoining the buffer layer 110). In some embodiments, the graded aluminum gallium nitride layer has two layers having the x ratio in the range of 0.5-0.9 for the bottom layer, and in the range of 0.1-0.5 for the top layer. In some embodiments, instead of having multiple layers with different x ratios, the graded aluminum gallium nitride layer has a continuous gradient of the x ratio. In some embodiments, the transition layer 106 has a thickness that ranges from about 0.1 micrometers (μm) to 5 micrometers (μm)

In some embodiments, the nucleation layer 104 and the transition layer 106 are formed by an epitaxial growth process. Examples of epitaxial growth processes include, but are not limited to, a metal-organic chemical vapor deposition (MOCVD) process, a molecular beam epitaxy (MBE) process, and a hydride vapor phase epitaxy (HVPE) process.

Figure 1C:
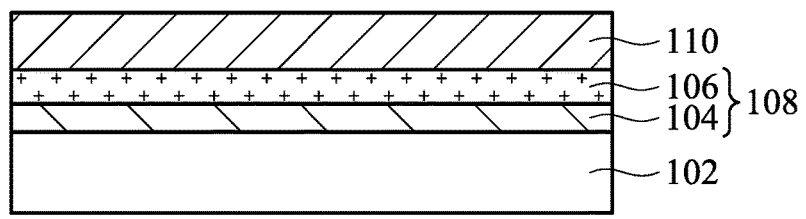

Next, as shown in FIG. 1C, a buffer layer 110 is formed over the transition structure 108, in accordance with some embodiments of the disclosure. The buffer layer 110 is configured to define a high resistivity layer for increasing the breakdown voltage of the HEMT device structure 100a. The buffer layer 110 has a resistivity higher than a resistivity of the channel layer 120 (shown in FIG. 1D).

In some embodiments, the buffer layer 110 includes one or more Group III-V compound layers. Examples of Group III-V compound layers include, but are not limited to, GaN, AlGaN, InGaN and InAlGaN. In some embodiments, the buffer layer 110 includes a dopant to achieve a predetermined high resistivity. In some embodiments, the dopant is a p-type dopant. In some embodiments, the buffer layer 110 includes GaN doped with the p-type dopant. Examples of the p-type dopant include, but are not limited to, carbon (C), iron (Fe), magnesium (Mg) and zinc (Zn). In some embodiments, the buffer layer 110 has a thickness in a range from about 0.1 micrometers (μm) to 5 micrometers (μm).

In some embodiments, the buffer layer 110 is formed by an epitaxial growth process. Examples of epitaxial growth processes include, but are not limited to, a metal-organic chemical vapor deposition (MOCVD) process, a molecular beam epitaxy (MBE) process, and a hydride vapor phase epitaxy (HVPE) process.

Figure 1D:
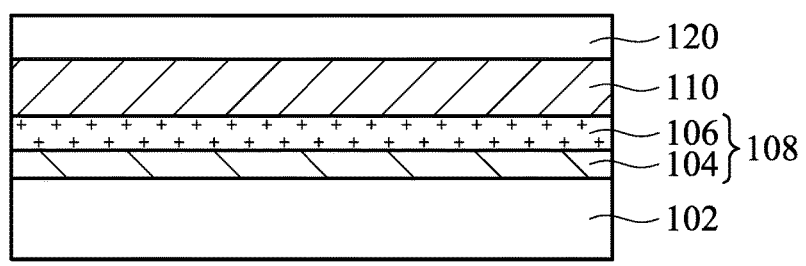

Afterwards, as shown in FIG. 1D, the channel layer 120 is formed over the buffer layer 110, in accordance with some embodiments of the disclosure. The channel layer 120 has a lower resistivity than the buffer layer 110, for improving current performance of the HEMT device structure 100a.

In some embodiments, the channel layer 120 includes one or more Group III-V compound layers. Examples of Group III-V compound layers include, but are not limited to, GaN, AlGaN, InGaN and InAlGaN. One or more of the Group III-V compound layers is doped. In some embodiments, the channel layer 120 includes alternatingly arranged p-doped and n-doped Group III-V compound layers. In some embodiments, the channel layer 120 includes a p-doped GaN layer. Examples of the p-type dopant in the p-doped GaN layer include, but are not limited to, carbon (C), iron (Fe), magnesium (Mg) and zinc (Zn). In some other embodiment, the channel layer 120 includes a un-doped GaN layer. In some embodiments, the channel layer 120 has a thickness in a range from about 0.1 micrometers (μm) to 5 micrometers (μm).

In some embodiments, the channel layer 120 is formed by an epitaxial growth process. Examples of epitaxial growth processes include, but are not limited to, a metal-organic chemical vapor deposition (MOCVD) process, a molecular beam epitaxy (MBE) process, and a hydride vapor phase epitaxy (HVPE) process.

Figure 1E:
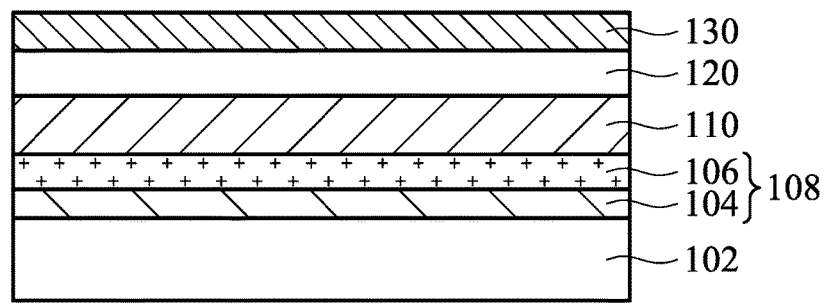

Afterwards, as shown in FIG. 1E, an active layer 130 is formed over the channel layer 120, in accordance with some embodiments of the disclosure.

The active layer 130 configured to cause a two dimensional electron gas (2DEG) to be formed in the channel layer 120 along an interface 125 between the channel layer 120 and the active layer 130. A heterojunction is formed between the active layer 130 and the channel layer 120. A band gap discontinuity exists between the active layer 130 and the channel layer 120. In some embodiments, the band gap of the active layer 130 is greater than the band gap of the channel layer 120. The electrons from a piezoelectric effect in the active layer 130 drop into the channel layer 120, and thus create a thin layer 122 of highly mobile conducting electrons, i.e., the 2DEG, in the channel layer 120, adjacent the interface 125 with the active layer 130. The electrons in the 2DEG are charge carriers in the channel layer 120.

Due to the naturally occurring 2DEG and without the gate structure, the HEMT device structure 100a would be conductive without the application of a voltage to the gate electrode. Therefore, the HEMT device structure 100a would be a normally ON device with a negative threshold voltage. Such a normally ON state is a design concern in power applications where it is desirable to prevent, or substantially inhibit, current from flowing in or through the HEMT device structure 100a.

Figure 1F:
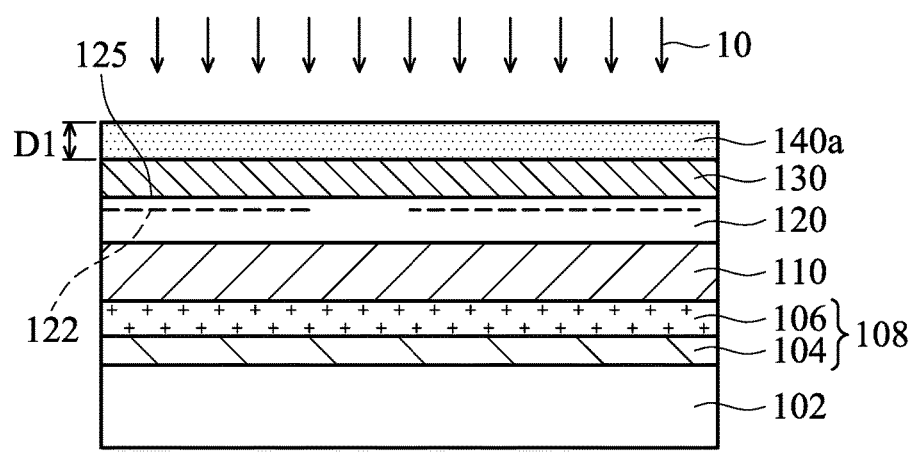
Figure 1G:
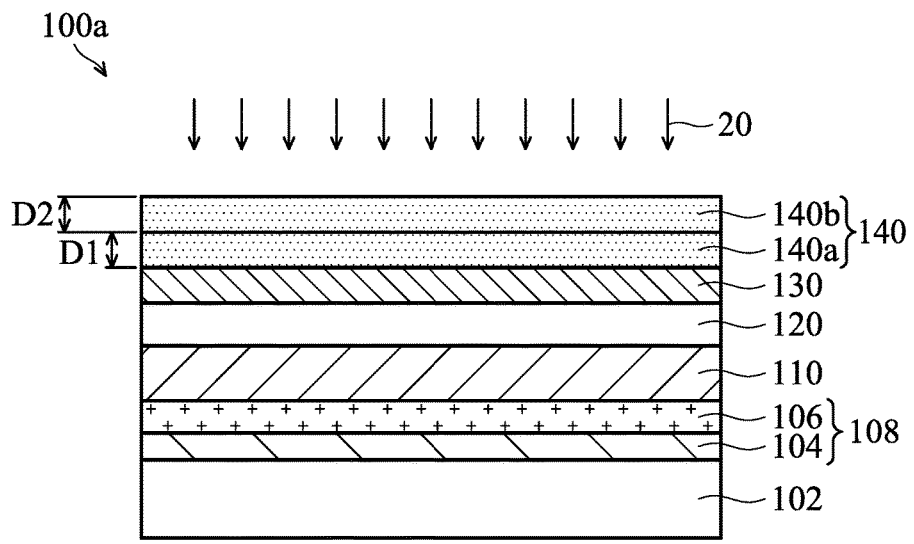
Figure 1H:
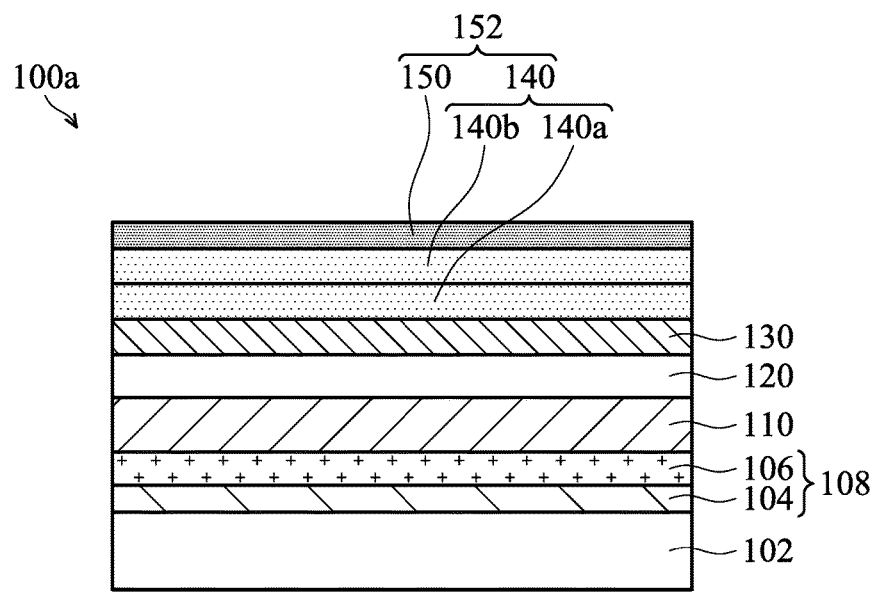
Figure 1:
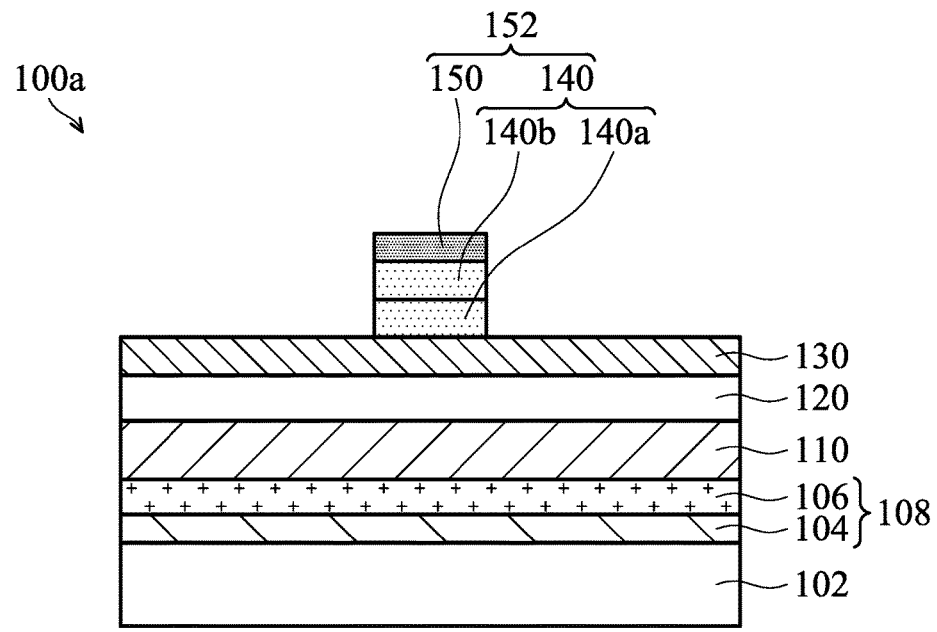
Figure 1:
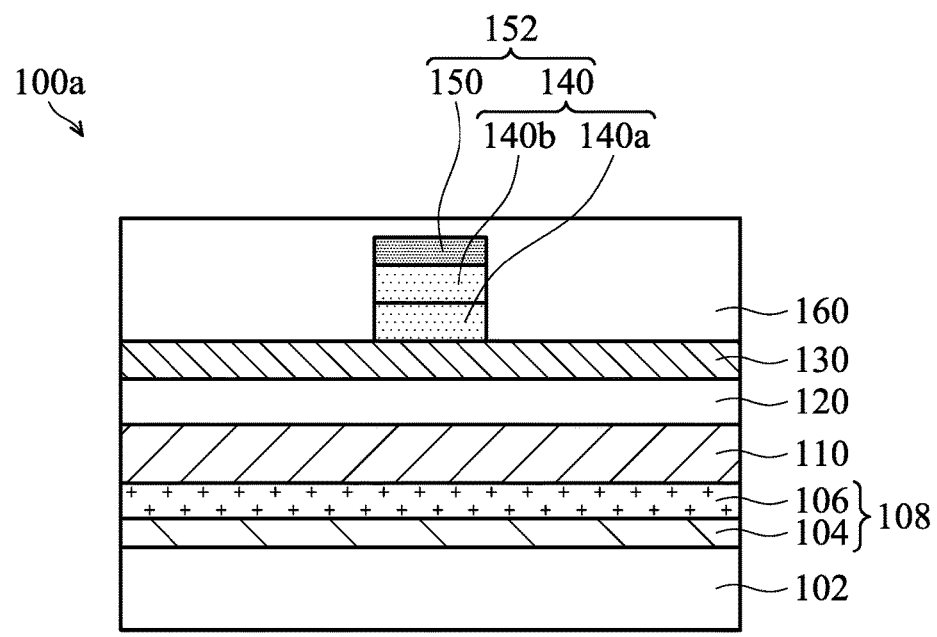
Figure 1K:
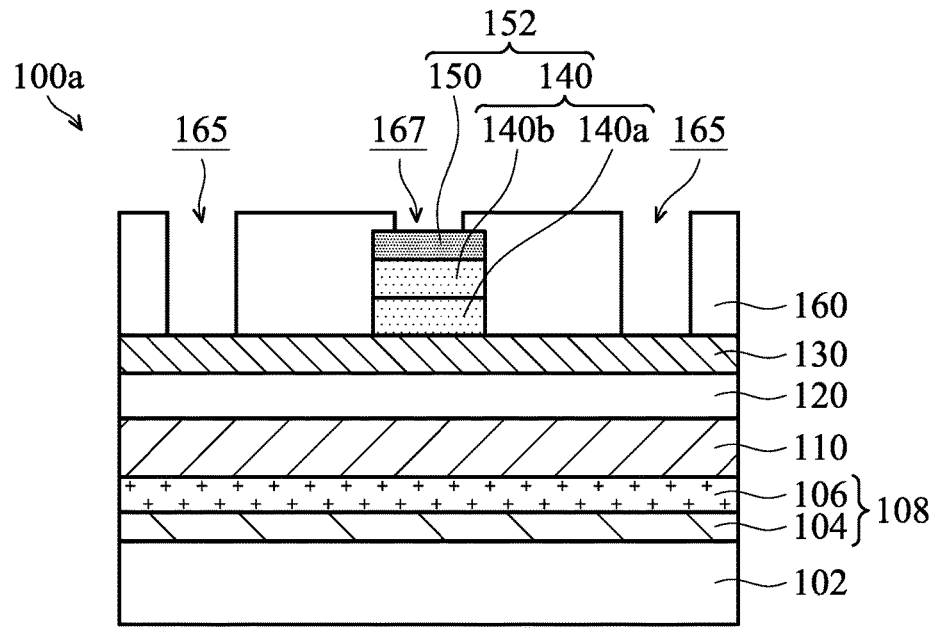
Figure 1L:
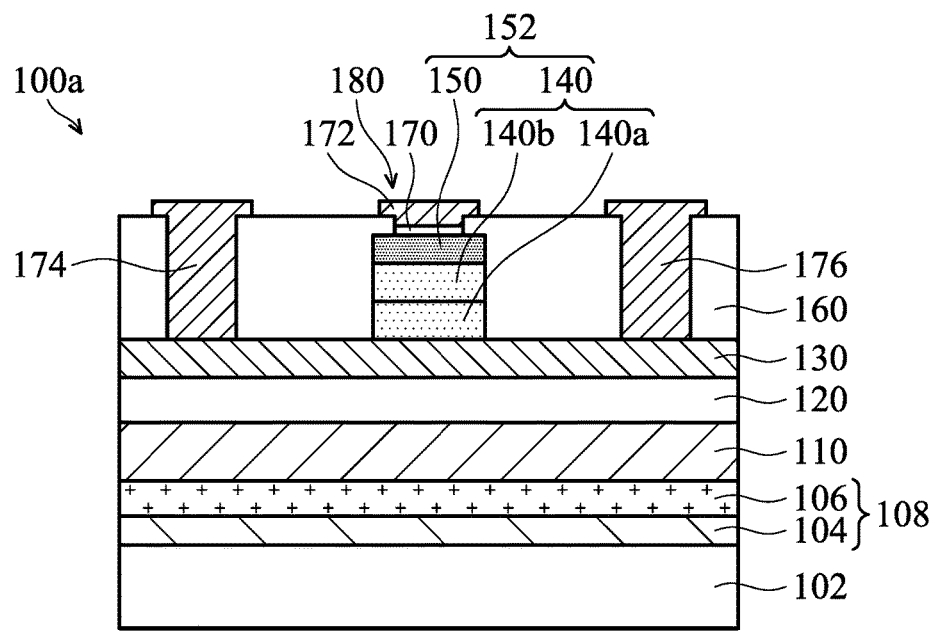

In some embodiments, to convert a normally ON HEMT device structure 100a to a normally OFF HEMT device structure 100a, a gate structure 180 (shown in FIG. 1L) over the active layer 130 is configured to deplete the 2DEG under the gate structure 180 (shown in FIG. 1L).

In some embodiments, the active layer 130 includes one or more Group III-V compound layers which are different from the Group III-V compound layers of the channel layer 120 in composition. In some embodiments, the active layer 130 comprises aluminum nitride (AlN), graded aluminum gallium nitride ($Al_yGa_{(1-y)}N$) (where y is the aluminum content ratio, and y is in a range from 0 to 1), or a combination thereof. In some embodiments, the active layer 130 is formed by an epitaxial growth process. Examples of epitaxial growth processes include, but are not limited to, a metal-organic chemical vapor deposition (MOCVD) process, a molecular beam epitaxy (MBE) process, and a hydride vapor phase epitaxy (HVPE) process.

Afterwards, as shown in FIG. 1F, a first p-doped gallium nitride (p-GaN) layer or the first p-doped aluminum gallium nitride (p-AlGaN) layer 140a is formed over the active layer 130, in accordance with some embodiments of the disclosure.

In some embodiments, the first p-GaN layer or the first p-AlGaN layer 140a has a first doping concentration, and the first doping concentration has a constant concentration. Examples of the p-type dopant in the p-doped GaN layer or p-doped AlGaN layer include, but are not limited to, carbon (C), iron (Fe), magnesium (Mg) and zinc (Zn). In some embodiments, the first p-GaN layer or the first p-AlGaN layer 140a has a doping concentration in a range from about 1E8 to about 1E21 atom/cm3.

In some embodiments, the first p-GaN layer or the first p-AlGaN layer 140a is formed by a first epitaxial growth process 10. Examples of epitaxial growth processes include, but are not limited to, a metal-organic chemical vapor deposition (MOCVD) process, a molecular beam epitaxy (MBE) process, and a hydride vapor phase epitaxy (HVPE) process.

The first p-GaN layer or the first p-AlGaN layer 140a has a first thickness $D_1$. In some embodiments, the first thickness $D_1$ is in a range from about 10 nm to about 200 nm.

Next, as shown in FIG. 1G, a second p-doped gallium nitride (p-GaN) layer or the second p-doped aluminum gallium nitride (p-AlGaN) layer 140b is formed over the first p-GaN layer or the first P-AlGaN layer 140a, in accordance with some embodiments of the disclosure. In some embodiments, the first p-GaN layer 140a and the second p-GaN layer 140b are used to form a p-GaN layer 140. In some other embodiments, the first p-AlGaN layer 140a and the second p-AlGaN layer 140b are used to form a p-AlGaN layer 140.

In some embodiments, the second p-GaN layer or the second p-AlGaN layer 140b is formed by a second epitaxial growth process 20. Examples of epitaxial growth processes include, but are not limited to, a metal-organic chemical vapor deposition (MOCVD) process, a molecular beam epitaxy (MBE) process, and a hydride vapor phase epitaxy (HVPE) process. In some embodiments, the second p-GaN layer or the second p-AlGaN layer 140b has a doping concentration in a range from about 1E17 to about 1E20 atom/cm3.

The second p-GaN layer or the second p-AlGaN layer 140b has a second doping concentration, and the second doping concentration has a stepwise or gradient doping concentration. The first doping concentration is higher than the second doping concentration. In other words, the second doping concentration is lower than the first doping concentration. The second doping concentration has a gradient concentration which is gradually decreased from a bottom surface of the second p-GaN layer or the second p-AlGaN layer 140b to a top surface of the second p-GaN layer or the second p-AlGaN layer 140b. The second doping concentration has a stepwise concentration which is stepwise decreased from a a bottom surface of the second p-GaN layer or the second p-AlGaN layer 140b to a top surface of the second p-GaN layer or the second p-AlGaN layer 140b. The stepwise or gradient doping concentration of the second p-GaN layer or the second p-GaN layer 140b is measured by a secondary ion mass spectrometry (SIMS). The SIMS data shows that the doping concentration of the second p-GaN (or p-AlGaN) layer 140b is gradually or stepwise decreased from a first interface between the first p-GaN (or p-AlGaN) layer 140a and the second p-GaN (or p-AlGaN) layer 140b to a second interface between the second p-GaN layer (or p-AlGaN) 140b and the n-GaN (or n-AlGaN) layer 150.

When the HEMT device structure 100a is operated in high power devices, it will experience a high electric field at the gate-to-drain region. If the gate operation voltage is too low to sustain the high electric field, the HEMT device structure 100a may burn out or have a reduced lifetime. If there is a single p-GaN layer with a constant doping concentration over the active layer 130, the gate operation voltage of HEMT device structure has a low gate operation voltage. In order to increase the gate operation voltage of HEMT device structure, the second p-GaN (or p-AlGaN) layer 140b with stepwise or gradient doping concentration is used. The stepwise or gradient concentration of the second p-GaN layer (or p-AlGaN layer) 140a is configured to provide a relative lower electrical filed than the first p-GaN (or p-AlGaN) layer 140a, and therefore the gate operation voltage is improved. In some embodiments, the gate operation voltage of HEMT device structure 100a is increased to have about 16 V to 18 V. In addition, the Id (drain current) vs. $V_g$ (gate voltage) current-voltage characteristic of the HEMT device structure 100a is improved to prevent the current hump phenomenon from occurring. The "current hump" is an undesirable discontinuity in the Id (drain current) vs. $V_g$ (gate voltage) current-voltage characteristic. This $I_d$-$V_g$ "hump" will result in less than desirable performance, or even degrade performance of the HEMT device structure 100a.

The first p-GaN (or p-AlGaN) layer 140a has the first thickness $D_1$, and the second p-GaN layer 140b has a second thickness $D_2$. In some embodiments, the second thickness $D_2$ of the second p-GaN (or p-AlGaN) layer 140b is in a range from about 10 nm to about 200 nm. In some embodiments, a ratio of the second thickness $D_2$ to the first thickness D1 is in a range from about 1/3 to 3/1. When the ratio in within above-mentioned range, the operation gate voltage is improved without risk of current hump.

Next, as shown in FIG. 1H, a n-doped gallium nitride (n-GaN) layer or a n-doped aluminum gallium nitride (n-AlGaN) layer 150 is formed over the second p-GaN (or p-AlGaN) layer 140b, in accordance with some embodiments of the disclosure. The n-GaN (or n-AlGaN) layer 150 is doped with a n-type dopant. Examples of the n-type dopant may include silicon (Si) or oxygen (O). In some embodiments, the n-GaN (or n-AlGaN) layer 150 has a thickness in a range from about 10 nm to about 50 nm.

The operations for forming the nucleation layer 104, the transition layer 106, the buffer layer 110, the channel layer 120, the active layer 130 and the p-GaN (or p-AlGaN) layer 140 and the n-GaN (or n-AlGaN) layer 150 are performed in the same chamber without removal to another chamber, thereby saving money and reducing pollution. In other words, the layers 104, 106, 110, 120, 130, 140a, 140b, and 150 are formed in-situ.

Afterwards, as shown in FIG. 1I, the n-GaN (or n-AlGaN) layer 150, the second p-GaN layer 140b and the first p-GaN (or p-AlGaN) layer 140a are patterned in a patterning process to form an NP structure 152, in accordance with some embodiments of the disclosure. As a result, a portion of the active layer 130 is exposed.

The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

Next, as shown in FIG. 1J, a passivation layer 160 is formed over the NP structure 152 and the top surface of the active layer 130, in accordance with some embodiments of the disclosure.

The passivation layer 160 may be made of silicon oxide, silicon nitride, silicon oxynitride, or a combination thereof. In some embodiments, the passivation layer 160 is formed by a deposition process, such as chemical vapor deposition (CVD) process, atomic layer deposition (ALD) process or another application deposition process.

Afterwards, as shown in FIG. 1K, two trenches 165 and a recess 167 are formed in the passivation layer 160, in accordance with some embodiments of the disclosure. The top surface of the active layer 130 is exposed by the trenches 165, and a top surface of the n-GaN (or n-AlGaN) layer 150 is exposed by the recess 167. The two trenches 165 are on opposite sides of the recess 167.

In some embodiments, the trenches 165 and the recess 167 are formed in an etching process, such a dry etching process or a wet etching process.

Afterwards, as shown in FIG. 1L, a gate dielectric layer 170 is formed in the recess 167 and on the n-GaN (or n-AlGaN) layer 150, and a gate electrode 172 is formed on the gate dielectric layer 170, in accordance with some embodiments of the disclosure. In addition, a source electrode 174 and a drain electrode 176 are formed in the trenches 165. The source electrode 174 and the drain electrode 176 penetrate through the passivation layer 160 and are on opposite sides of the gate electrode 172.

A gate structure 180 is constructed by the p-GaN (or p-AlGaN) layer 140, the n-GaN (or n-AlGaN) layer 150, the gate dielectric layer 170 and the gate electrode 172. The gate structure 180 over the active layer 130 is configured to deplete the 2DEG under the gate structure 180. In some embodiments, when sufficient voltage is applied to the gate electrode 172, it is possible to modulate a current (i.e., a drain current) flowing through the channel layer 120, from the drain electrode 176 to the source electrode 174.

The gate dielectric layer 170 is made of dielectric materials, such as silicon oxide, silicon nitride, silicon oxynitride, dielectric material with high dielectric constant (high-k), or a combination thereof. The gate dielectric layer 160 is formed by a deposition process, such as chemical vapor deposition (CVD), physical vapor deposition (PVD), atomic layer deposition (ALD), high density plasma CVD (HDP-CVD), metal organic CVD (MOCVD), plasma enhanced CVD (PECVD) or another applicable process.

The gate electrode 172, the source electrode 174 and the drain electrode 176 may be made of a stack of metal layers. The metal layer may be made of tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. The gate electrode 172, the source electrode 174 and the drain electrode 176 are formed by a deposition process. The gate electrode 172, the source electrode 174 and the drain electrode 176 are formed separately or simultaneously. The deposition process includes a chemical vapor deposition (CVD), a physical vapor deposition (PVD), an atomic layer deposition (ALD), a high density plasma CVD (HDPCVD), a metal organic CVD (MOCVD), a plasma enhanced CVD (PECVD), or another applicable process.

If the gate operation voltage is too low to sustain the high electric field, the HEMT device structure 100a may burn out or have a reduced lifetime. Therefore, the gate operation voltage of the HEMT device structure 100a is increased by using the n-GaN layer with a gradient doping concentration. Furthermore, the current hump phenomenon is prevented.

Figure 2A:
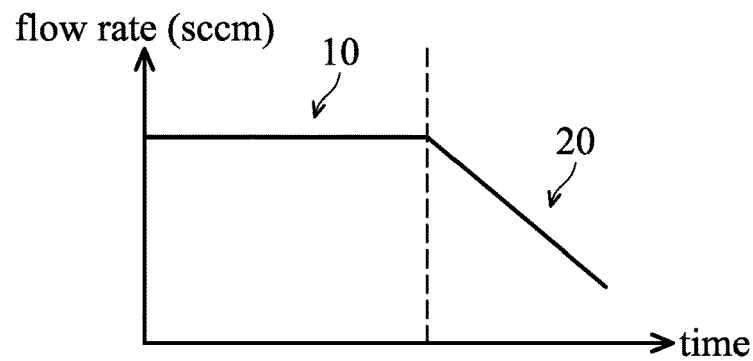
FIG. 2A shows the relationship between the deposition time and the flow rate of the first epitaxial growth process and the second epitaxial growth process, in accordance with some embodiments of the disclosure.

FIG. 2A shows the relationship between the epitaxial time and the flow rate of the first epitaxial growth process 10 and the second epitaxial growth process 20, in accordance with some embodiments of the disclosure.

The first epitaxial growth process 10 is used to form the first p-GaN layer 140a with a constant doping concentration, and therefore the flow rate of the first epitaxial growth process 10 maintains at a constant value as the time is increased. In some embodiments, the first p-GaN (or p-AlGaN) layer 140a is doped with the magnesium (Mg) by a metal-organic chemical vapor deposition (MOCVD) process. A gallium-containing source gas, a nitrogen-containing source gas, and a magnesium-containing source gas are introduced into the MOCVD chamber. In some embodiments, the magnesium-containing source gas has a flow rate in a range from about 10 to about 10000. The flow rate is a constant value as the time is increased.

The second epitaxial growth process 20 is used to form the second p-GaN (or p-AlGaN) layer 140b with a gradient doping concentration, and therefore the flow rate of the second epitaxial growth process 20 is gradually decreased as the time is increased. In some embodiments, the second p-GaN (or p-AlGaN) layer 140b is doped with the magnesium (Mg) by a metal-organic chemical vapor deposition (MOCVD) process. In some embodiments, the flow rate of the magnesium-containing source gas is decreased from 100% to 1% of source gas in 1 to 100 minutes. The flow rate is controlled to be gradually decreased as the time is increased.

Figure 2B:
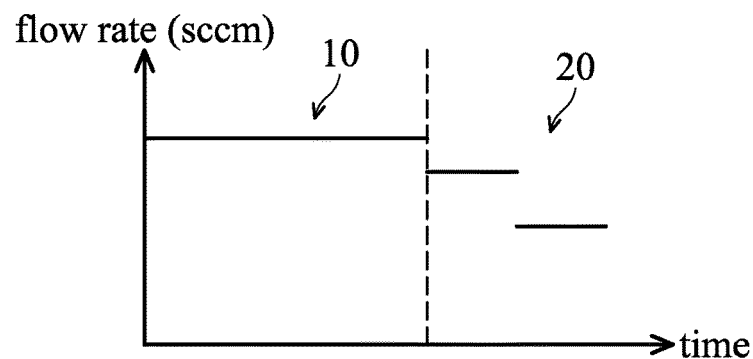
FIG. 2B shows the relationship between the deposition time and the flow rate of the first epitaxial growth process and the second epitaxial growth process, in accordance with some embodiments of the disclosure.

FIG. 2B shows the relationship between the epitaxial time and the flow rate of the first epitaxial growth process 10 and the second epitaxial growth process 20, in accordance with some embodiments of the disclosure. The first epitaxial growth process 10 is used to form the first p-GaN layer 140a with a constant doping concentration, and therefore the flow rate of the first epitaxial growth process 10 maintains at a constant value as the time is increased. The second epitaxial growth process 20 is used to form the second p-GaN (or p-AlGaN) layer 140b with a stepwise doping concentration, and therefore the flow rate of the second epitaxial growth process 20 is stepwise decreased as the time is increased.

Figure 2C:
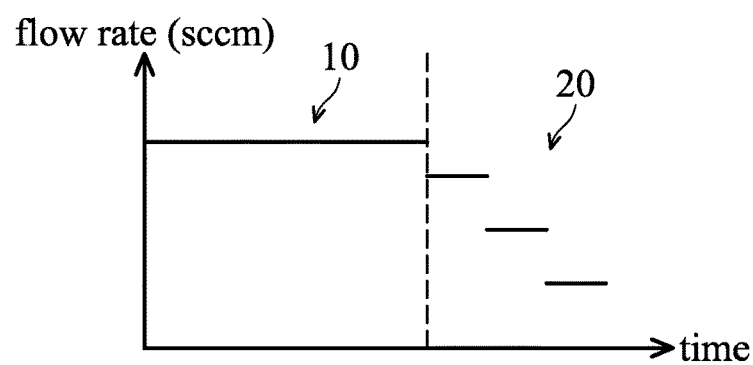
FIG. 2C shows the relationship between the deposition time and the flow rate of the first epitaxial growth process and the second epitaxial growth process, in accordance with some embodiments of the disclosure.

FIG. 2C shows the relationship between the epitaxial time and the flow rate of the first epitaxial growth process 10 and the second epitaxial growth process 20, in accordance with some embodiments of the disclosure. Similar to FIG. 2A, the second epitaxial growth process 20 is used to form the second p-GaN (or p-AlGaN) layer 140b with a stepwise doping concentration. The difference is that more than two steps are shown in FIG. 2C. In some other embodiments, the flow rate includes at least three steps to form the stepwise doping concentration.

Figure 3A:
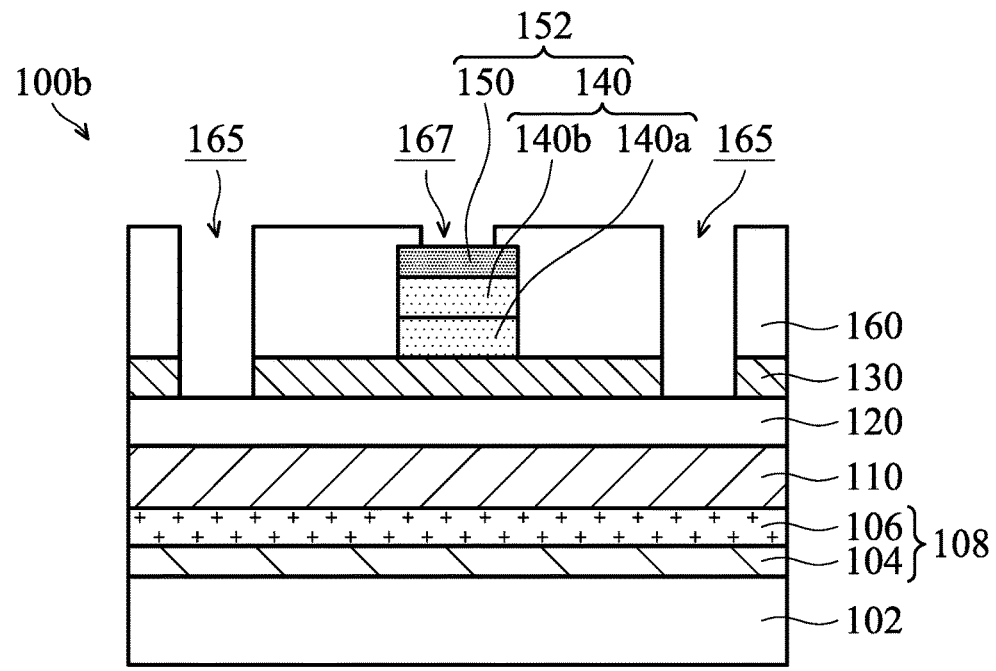
FIGS. 3A-3B show cross-sectional representations of various stages of forming a HEMT device structure, in accordance with some embodiments of the disclosure.
Figure 3B:
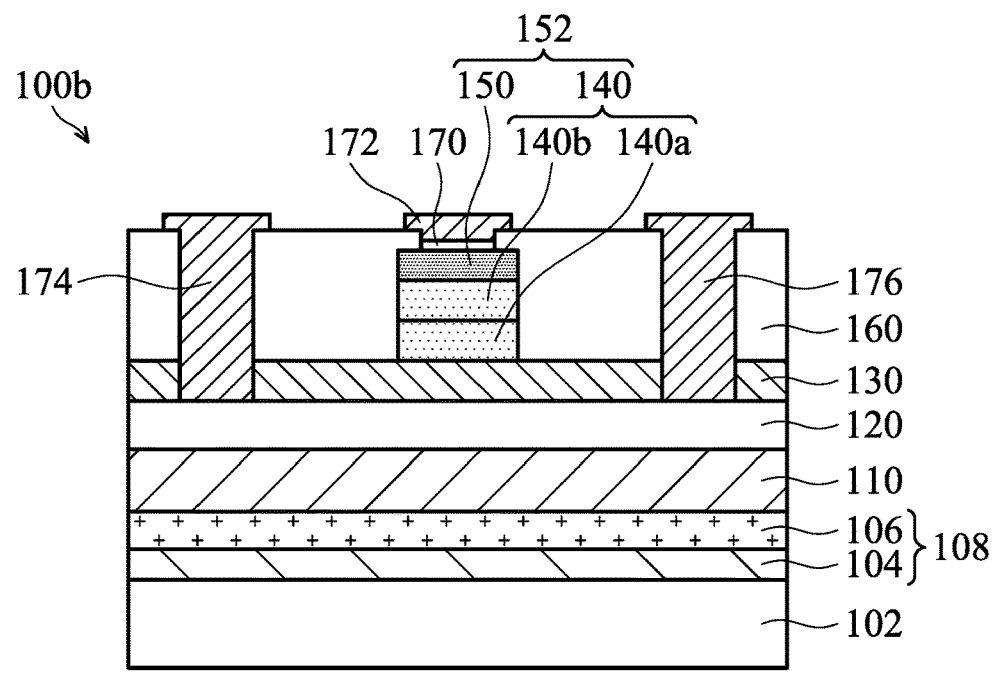

FIGS. 3A-3B show cross-sectional representations of various stages of forming a HEMT device structure 100b, in accordance with some embodiments of the disclosure. The HEMT device structure 100b is similar to, or the same as, the HEMT device structure 100a shown in FIG. 1K, except that the trenches 165 is through the active layer 130 in FIG. 3A. Processes and materials used to form the HEMT device structure 100b may be similar to, or the same as, those used to form the HEMT device structure 100a and are not repeated herein.

As shown in FIG. 3A, the trenches 165 passes through the passivation layer 160, but also passes through the active layer 130. As a result, a portion of the channel layer 120 is exposed.

Afterwards, as shown in FIG. 3B, the gate dielectric layer 170 is formed in the recess 167, and the gate electrode 172 is formed on the gate dielectric layer 170, in accordance with some embodiments of the disclosure. Furthermore, the source electrode 174 and the drain electrode 176 are formed in the trenches 165. A bottom surface of the source electrode 174 is leveled with a bottom surface of the active layer 130. A bottom surface of the drain electrode 176 is leveled with a bottom surface of the active layer 130.

Figure 4A:
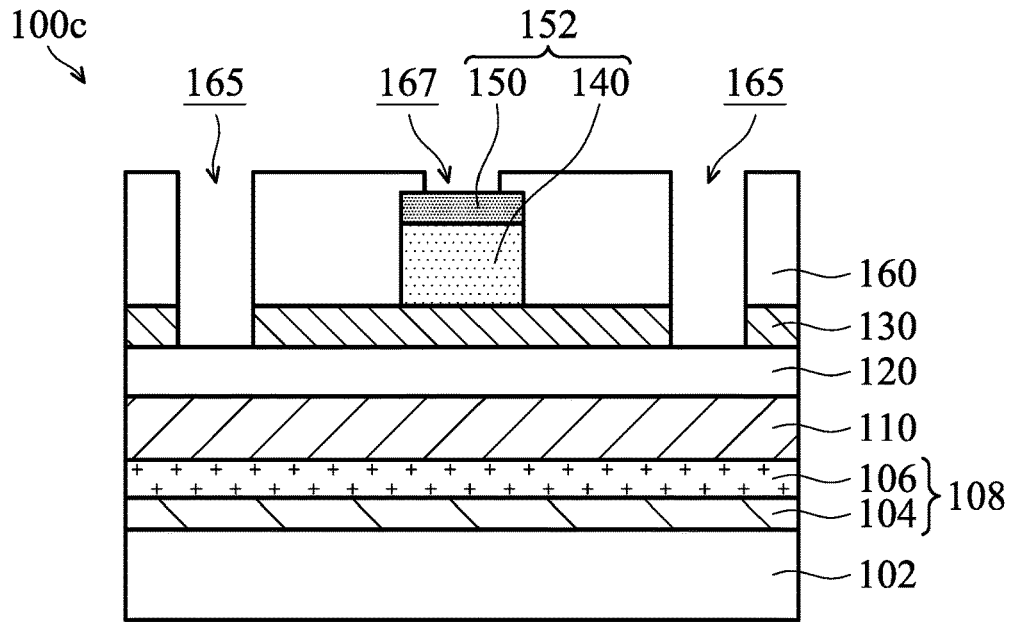
FIGS. 4A-4B show cross-sectional representations of various stages of forming a HEMT device structure, in accordance with some embodiments of the disclosure.
Figure 4B:
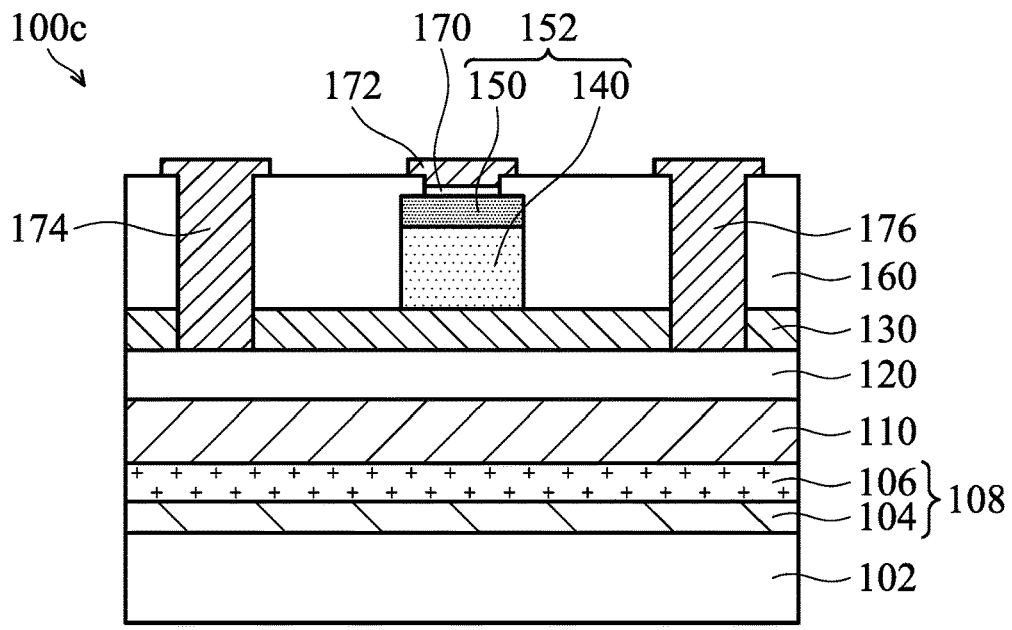

FIGS. 4A-4B show cross-sectional representations of various stages of forming a HEMT device structure 100c, in accordance with some embodiments of the disclosure. The HEMT device structure 100c is similar to, or the same as, the HEMT device structure 100b shown in FIG. 3A, except that a single p-GaN layer 140 is formed over the active layer 130 in FIG. 4A. Processes and materials used to form the HEMT device structure 100c may be similar to, or the same as, those used to form the HEMT device structure 100b and are not repeated herein.

As shown in FIG. 4A, the single p-GaN layer 140 is formed over the active layer 130, and the single p-GaN layer 140 has a gradient doping concentration. The advantage of the gradient doping concentration is that the gate operation voltage of the HEMT device structure 100c is improved without current hump phenomenon.

Next, as shown in FIG. 4B, the gate dielectric layer 170 is formed in the recess 167, and the gate electrode 172 is formed on the gate dielectric layer 170, in accordance with some embodiments of the disclosure. The source electrode 174 and the drain electrode 176 are formed in the trenches 165 and through the active layer 130. The bottom surface of the source electrode 174 is leveled with a bottom surface of the active layer 130.

Figure 5A:
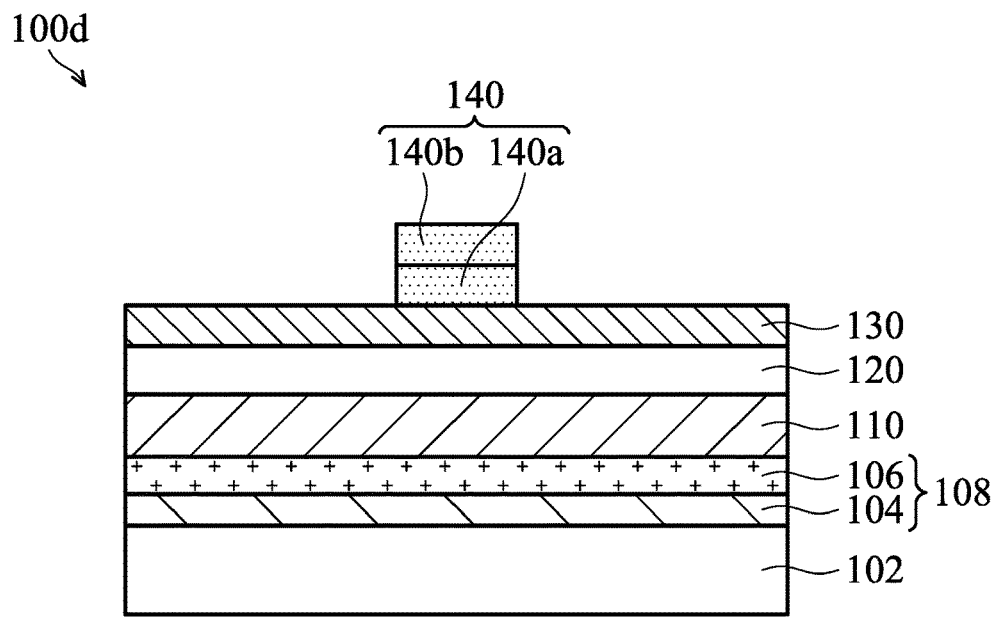
FIGS. 5A-5B show cross-sectional representations of various stages of forming a HEMT device structure, in accordance with some embodiments of the disclosure.
Figure 5B:
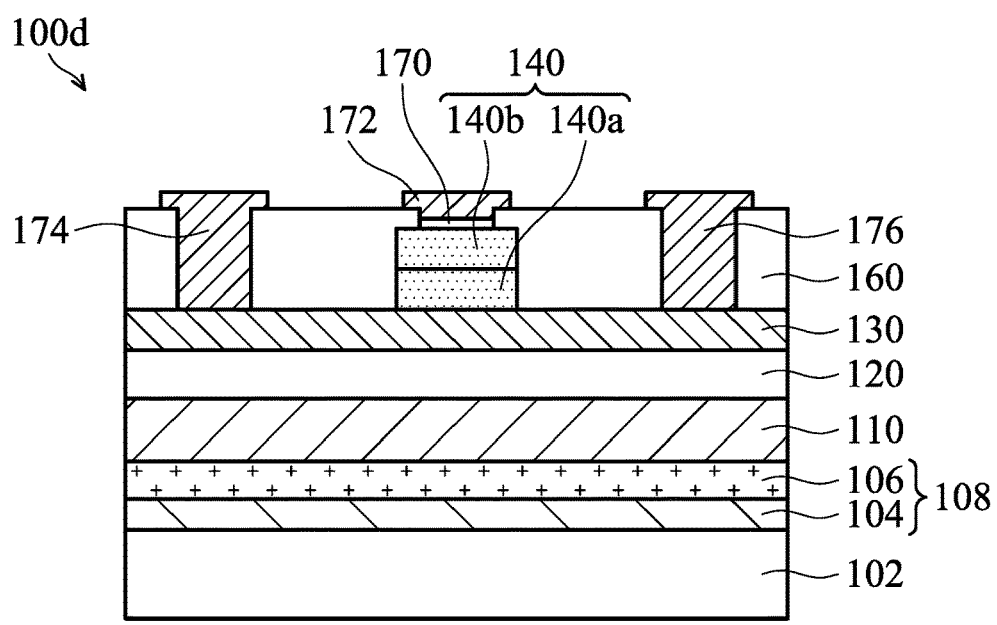

FIGS. 5A-5B show cross-sectional representations of various stages of forming a HEMT device structure 100d, in accordance with some embodiments of the disclosure. The HEMT device structure 100d is similar to, or the same as, the HEMT device structure 100a shown in FIG. 3A, except that no n-GaN (or n-AlGaN) layer 150 is formed over the second p-GaN layer 140b in FIG. 5A. Processes and materials used to form the HEMT device structure 100d may be similar to, or the same as, those used to form the HEMT device structure 100a and are not repeated herein.

As shown in FIG. 5A, the first p-GaN layer 140a and the second p-GaN layer 140b are sequentially formed on the active layer 130. The first p-GaN layer 140a has a first doping concentration. The second p-GaN layer 140b has a second doping concentration that is lower than the first doping concentration. The second doping concentration has a gradient doping concentration which is gradually decreased from the bottom surface of the second p-GaN layer 140b to the top surface of the second p-GaN layer 140b. The gradient doping concentration of the second p-GaN layer 140b may be measured by a secondary ion mass spectrometry (SIMS).

Next, as shown in FIG. 5B, the gate dielectric layer 170 is formed over the second p-GaN layer 140b and in direct contact with the second p-GaN layer 140b, and the gate electrode 172 is formed on the gate dielectric layer 170, in accordance with some embodiments of the disclosure.

Several embodiments for forming the HEMT device structure are provided. The HEMT device structure includes a gate structure including a p-GaN layer. The p-GaN layer may be a single layer with a gradient doping concentration (e.g. FIG. 4B) or a two-layered structure with a first p-GaN layer with a constant doping concentration and a second GaN layer with a gradient doping concentration (e.g. FIG. 1L, 3B 5B). The gate operation voltage of the HEMT device structure is increased by using the gradient doping concentration, and the current hump phenomenon is prevented Embodiments for forming a high electron mobility transistor (HEMT) device structure and method for formation of the same are provided. The HEMT device structure includes a transition structure over a substrate, a buffer layer over the transition structure. A channel layer over the buffer layer, and an active layer over the channel layer. A gate structure formed over the active layer, and the gate structure includes a p-GaN layer with a gradient doping concentration. The gate operation voltage of the HEMT device structure is increased and the current hump is prevented. Therefore, the performance of the HEMT device structure is improved.

In some embodiments, a high electron mobility transistor (HEMT) device structure is provided. The HEMT device structure includes a channel layer formed over a substrate and an active layer formed over the channel layer. The HEMT device structure also includes a gate structure formed over the active layer, and the gate structure includes: a p-doped gallium nitride (p-GaN) layer or a p-doped aluminum gallium nitride (p-AlGaN) layer formed over the active layer, and a portion of the p-GaN layer or a portion of the p-AlGaN layer has a stepwise or gradient doping concentration. The HEMT device structure also includes a gate electrode over the p-GaN layer or the p-AlGaN layer.

In some embodiments, a high electron mobility transistor (HEMT) device structure is provided. The HEMT device structure includes a channel layer formed over a substrate and an active layer formed over the channel layer. The active layer comprises aluminum gallium nitride ($Al_yGa_{1-y}N$, y is in a range from 0 to 1). The HEMT device structure also includes a passivation layer formed over the active layer and a first p-doped gallium nitride (p-GaN) layer or a p-doped aluminum gallium nitride (p-AlGaN) layer in the passivation and over the activelayer. The first p-GaN layer or the first p-AlGaN layer has a first doping concentration, and a second p-doped gallium nitride (p-GaN) layer or a second p-doped aluminum gallium nitride (p-AlGaN) layer over the first p-GaN layer or the first p-AlGaN layer. The second p-GaN layer or the second p-AlGaN layer has a second doping concentration lower than the first doping concentration. The HEMT device structure further includes a gate electrode formed over the second p-GaN layer or the second p-AlGaN layer, and a portion of the gate electrode is embedded in the passivation layer.

In some embodiments, a high electron mobility transistor (HEMT) device structure is provided. The HEMT device structure includes a channel layer formed over a substrate and an active layer formed over the channel layer. The active layer comprises aluminum gallium nitride ($Al_yGa_{1-y}N$, y is in range from 0 to 1). The HEMT device structure includes a first p-doped gallium nitride (p-GaN) layer or a first p-doped aluminum gallium nitride (p-AlGaN) layer formed over the active layer, and the first portion has a constant doping concentration. The HEMT device structure also includes a second p-GaN layer or a second p-AlGaN layer formed over the first p-GaN layer or the first p-AlGaN layer, and the second portion has a gradient doping concentration. The HEMT device structure further includes a n-doped gallium nitride (n-GaN) layer over the second p-GaN layer or the second p-AlGaN layer; and a gate electrode formed over the n-GaN layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A high electron mobility transistor (HEMT) device structure, comprising:
a channel layer formed over a substrate;
an active layer formed over the channel layer; and
a gate structure formed over the active layer, wherein the gate structure comprises:
a p-doped gallium nitride (p-GaN) layer or a p-doped aluminum gallium nitride (p-AlGaN) layer formed over the active layer, wherein a portion of the p-GaN layer or a portion of the p-AlGaN layer has a stepwise or gradient doping concentration, and the other portion of the p-GaN layer or the p-AlGaN layer has a constant concentration, and the constant concentration is higher than the gradient doping concentration; and a gate electrode over the p-GaN layer or the p-AlGaN layer.

2. The high electron mobility transistor (HEMT) device structure as claimed in claim 1, wherein the gate structure further comprises:
a n-doped gallium nitride (n-GaN) layer between the p-GaN layer or the p-AlGaN layer and the gate electrode.

3. The high electron mobility transistor (HEMT) device structure as claimed in claim 1, wherein the gradient doping concentration is gradually decreased from a bottom surface of the p-GaN layer to a top surface of the p-GaN layer, or a bottom surface of the p-AlGaN layer to a top surface of the p-AlGaN layer.

4. The high electron mobility transistor (HEMT) device structure as claimed in claim 1, wherein the p-doped gallium nitride (p-GaN) layer or the p-doped aluminum gallium nitride (p-AlGaN) layer is doped with a p-type dopant, and the p-type dopant comprises carbon (C), iron (Fe), magnesium (Mg) or zinc (Zn).

5. The high electron mobility transistor (HEMT) device structure as claimed in claim 1, wherein the band gap of the active layer is greater than the band gap of the channel layer.

6. The high electron mobility transistor (HEMT) device structure as claimed in claim 1, further comprising:
a transition structure over the substrate; and
a buffer layer over the transition structure, wherein the buffer layer is formed between the transition structure and the channel layer.

7. The high electron mobility transistor (HEMT) device structure as claimed in claim 6, wherein the buffer layer has a resistivity higher than a resistivity of the channel layer.

8. The high electron mobility transistor (HEMT) device structure as claimed in claim 1, further comprising:
a source electrode and a drain electrode formed over the channel layer, wherein the source electrode and the drain electrode pass through the active layer.

9. The high electron mobility transistor (HEMT) device structure as claimed in claim 8, further comprising:
a passivation layer over the active layer, wherein the source electrode and the drain electrode pass through the passivation layer.

10. The high electron mobility transistor (HEMT) device structure as claimed in claim 1, further comprising:
a two dimensional electron gas (2DEG) in the channel layer adjacent to an interface between the channel layer and the active layer.

11. A high electron mobility transistor (HEMT) device structure, comprising:
a channel layer formed over a substrate;
an activelayer formed over the channel layer, wherein the activelayer comprises aluminum gallium nitride (Aly-Gal-yN, y is in a range from 0 to 1);
a passivation layer formed over the active layer;
a first p-doped gallium nitride (p-GaN) layer or a first p-doped aluminum gallium nitride (p-AlGaN) layer in the passivation and over the active layer, wherein the first p-GaN layer has a first doping concentration;
a second p-doped gallium nitride (p-GaN) layer or a second p-doped aluminum gallium nitride (p-AlGaN) layer over the first p-GaN layer or the first p-AlGaN layer, wherein the second p-GaN layer or the second p-AlGaN layer has a second doping concentration lower than the first doping concentration; and
a gate electrode formed over the second p-GaN layer or the second p-AlGaN layer, wherein a portion of the gate electrode is embedded in the passivation layer.

12. The high electron mobility transistor (HEMT) device structure as claimed in claim 11, further comprising:
a n-doped gallium nitride (n-GaN) layer over the second p-GaN layer or the second p-AlGaN layer; and
a gate dielectric layer over the n-GaN layer, wherein the gate dielectric layer is between the n-GaN layer and the gate electrode.

13. The high electron mobility transistor (HEMT) device structure as claimed in claim 11, the second doping concentration has a gradient doping concentration which is gradually decreased from a bottom surface of the second p-GaN layer to a top surface of the second p-GaN layer, or from a bottom surface of the second p-AlGaN layer to a top surface of the second p-AlGaN layer.

14. The high electron mobility transistor (HEMT) device structure as claimed in claim 11, further comprising:
a source electrode and a drain electrode formed over the channel layer, wherein the source electrode and the drain electrode penetrate through the passivation layer and are on opposite sides of the gate electrode.

15. The high electron mobility transistor (HEMT) device structure as claimed in claim 11, further comprising:
a transition structure over the substrate; and
a buffer layer over the transition structure, wherein the buffer layer is between the transition structure and the channel layer.

16. The high electron mobility transistor (HEMT) device structure as claimed in claim 14, wherein the buffer layer has a resistivity higher than a resistivity of the channel layer.

17. A high electron mobility transistor (HEMT) device structure, comprising:
a channel layer formed over a substrate;
an active layer formed over the channel layer, wherein the active layer comprises aluminum gallium nitride ($Al_yGa_{1-y}N$, y is in range from 0 to 1);
a first p-doped gallium nitride (p-GaN) layer or a first p-doped aluminum gallium nitride (p-AlGaN) layer formed over the active layer, wherein the first portion has a constant doping concentration;

a second p-GaN layer or a second p-AlGaN layer formed over the first p-GaN layer or the first p-AlGaN layer, wherein the second portion has a gradient doping concentration;

a n-doped gallium nitride (n-GaN) layer over the second p-GaN layer or the second p-AlGaN layer; and a gate electrode formed over the n-GaN layer.

18. The high electron mobility transistor (HEMT) device structure as claimed in claim 17, wherein the gradient doping concentration is gradually decreased from a bottom surface of the second p-GaN layer to a top surface of the second p-GaN layer, or from a bottom surface of the second p-AlGaN layer to a top surface of the second p-AlGaN layer.

19. The high electron mobility transistor (HEMT) device structure as claimed in claim 17, further comprising:

a passivation layer formed on the gradient layer, wherein the n-GaN layer, the first p-GaN layer or the first p-AlGaN layer, and the second p-GaN layer or the second p-AlGaN layer are embedded in the passivation layer; and a source electrode and the drain electrode through the passivation layer.

20. The high electron mobility transistor (HEMT) device structure as claimed in claim 17, further comprising:

a nucleation layer over the substrate;

a transition layer over the nucleation layer; and a buffer layer over the transition layer, wherein the buffer layer is between the transition layer and the channel layer.

* * * * *